US012690318B2

(12) United States Patent
Choi et al.

(10) Patent No.: US 12,690,318 B2
(45) Date of Patent: Jul. 21, 2026

(54) DISPLAY DEVICE USING SEMICONDUCTOR LIGHT-EMITTING DIODES, AND METHOD FOR MANUFACTURING SAME

(71) Applicant: LG ELECTRONICS INC., Seoul (KR)

(72) Inventors: Wonseok Choi, Seoul (KR); Soohyun Kim, Seoul (KR); Sungmin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 904 days.

(21) Appl. No.: 17/798,798

(22) PCT Filed: Mar. 23, 2020

(86) PCT No.: PCT/KR2020/003940
§ 371 (c)(1),
(2) Date: Aug. 10, 2022

(87) PCT Pub. No.: WO2020/122696
PCT Pub. Date: Jun. 18, 2020

(65) Prior Publication Data
US 2023/0135290 A1     May 4, 2023

(30) Foreign Application Priority Data

Feb. 10, 2020    (KR) ......................... 10-2020-0015794

(51) Int. Cl.
*H10H 29/14*        (2025.01)
*H10H 20/01*        (2025.01)

*H10H 20/832*        (2025.01)
*H10H 20/857*        (2025.01)

(52) U.S. Cl.
CPC ........ *H10H 29/142* (2025.01); *H10H 20/018* (2025.01); *H10H 20/832* (2025.01); *H10H 20/857* (2025.01); *H10H 20/0364* (2025.01)

(58) Field of Classification Search
CPC .. H10H 29/142; H10H 20/018; H10H 20/832; H10H 20/857
USPC ......................................................... 257/89
See application file for complete search history.

(56) References Cited

U.S. PATENT DOCUMENTS 10,825,884 B2 * 11/2020 Liu ...................... G09G 3/3275

FOREIGN PATENT DOCUMENTS

| | | |
|---|---|---|
| KR | 10-2018-0007376 A | 1/2018 |
| KR | 10-2018-0055021 A | 5/2018 |
| KR | 10-2019-0075869 A | 7/2019 |
| KR | 10-2019-0085892 A | 7/2019 |
| KR | 10-2019-0104277 A | 9/2019 |

(Continued)

*Primary Examiner* — Jasmine J Clark
(74) *Attorney, Agent, or Firm* — Birch, Stewart, Kolasch & Birch, LLP

(57)        ABSTRACT

Discussed is a display device that can include a base unit, a data wire and a gate wire arranged in columns and rows, respectively, and on the base unit to intersect each other, a power wire extending in a same direction as the data wire, thin film transistors connected to the data wire and the gate wire, and a semiconductor light-emitting diode electrically connected to the thin film transistors. A pair of residual assembly electrodes overlapping the semiconductor light-emitting diode are also provided.

18 Claims, 16 Drawing Sheets

(56)         References Cited

FOREIGN PATENT DOCUMENTS

| KR | 10-2019-0126260 A | 11/2019 |
| KR | 10-2020-0010701 A | 1/2020 |

* cited by examiner 155   154   153   159

155   154   153

159

156        155   154   153

159

(a)

(b)

DISPLAY DEVICE USING SEMICONDUCTOR LIGHT-EMITTING DIODES, AND METHOD FOR MANUFACTURING SAME

CROSS REFERENCE TO RELATED APPLICATIONS

This application is the National Stage filing under 35 U.S.C. 371 of International Application No. PCT/KR2020/003940, filed on Mar. 23, 2020, which claims the benefit of earlier filing date and right of priority to Korean Application No. 10-2020-0015794, filed on Feb. 10, 2020, the contents of all these applications are hereby incorporated by reference herein in their entirety.

TECHNICAL FIELD

The present disclosure relates to a display device using semiconductor light-emitting diodes, and one particular implementation relates to a display device using semiconductor light-emitting diodes having a size of several to several tens of μm.

BACKGROUND ART

In recent years, in the field of display technology, liquid-crystal displays (LCDs), organic light-emitting diodes (OLED) displays, microLED displays, etc. have been competing to realize large-area displays.

Semiconductor light-emitting diodes (microLEDs) with a diameter or cross-sectional area less than 100 μm, when used in displays, may offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick & place, laser lift-off (LLO), and self-assembly. Among these technologies, the self-assembly approach is a method that allows semiconductor light-emitting diodes to find their positions on their own in a fluid, which is most advantageous in realizing large-screen display devices.

Self-assembly methods may include a method of directly assembling a semiconductor light-emitting element on a final substrate to be used in a product, and a method of assembling a semiconductor light-emitting element on an assembly substrate and transferring the semiconductor light-emitting element to a final substrate through an additional transfer process. The direct assembly method on the final substrate is efficient in terms of process, and the method using the assembly substrate is advantageous in terms of additionally using a structure for self-assembly without limitation. Therefore, the two methods are selectively used.

DISCLOSURE OF INVENTION

Technical Problem

The present disclosure is directed to providing an active matrix-type display device to where a structure for self-assembly of a semiconductor light-emitting diodes is added. In particular, the present disclosure is directed to providing a display device capable of operating stably even if a structure for assembly is added to it.

Furthermore, the present disclosure is directed to providing a method for manufacturing the above display device.

Solution to Problem

A display according to the present disclosure may include: a base unit; a data wire and a gate wire arranged in columns and rows, respectively, on the base unit so as to intersect each other;
a power wire extending in the same direction as the data wire and disposed between two adjacent data wires; thin film transistors connected to the data wire and gate wire; a semiconductor light-emitting diode operating in connection with the thin film transistors; and a pair of residual assembly electrodes overlapping the semiconductor light-emitting diode.

According to the present disclosure, the pair of residual assembly electrodes may be formed in such a way as not to overlap the data wire and the power wire.

According to the present disclosure, the pair of residual assembly electrodes may include: a first residual assembly electrode protruding toward the semiconductor light-emitting diodes on the side of the data wire; and a second residual assembly electrode protruding toward the semiconductor light-emitting diodes on the side of the power wire.

According to the present disclosure, the display device may include: a first insulating layer disposed between the data wire and the power wire and the pair of residual assembly electrodes; a second insulating layer disposed between the pair of residual assembly electrodes and the semiconductor light-emitting diode; and a third insulating layer disposed to cover the semiconductor light-emitting diode.

According to the present disclosure, the data wire and the power wire may include: a first area overlapping the first insulating layer; and a second area overlapping the first insulating layer, the second insulating layer, and the third insulating layer.

A method for manufacturing a display device according to the present disclosure may include the steps of: (a) forming a data wire and a gate wire arranged in columns and rows, respectively, on a base unit so as to intersect each other, a power wire extending in the same direction as the data wire, and thin-film transistors connected to the data wire and the gate wire; (b) forming an assembly electrode in such a way as to extend in the same direction as the data wire, with an extension overlapping either the data wire or the power wire; (c) seating a semiconductor light-emitting diode in a preset position by applying a voltage signal to the assembly electrode; and (d) removing the extension of the assembly electrode.

According to the present disclosure, the base unit may include a pair of residual assembly electrodes which is left thereon after the removal of the assembly electrode, wherein the pair of residual assembly electrodes overlap the semiconductor light-emitting diode.

According to the present disclosure, the pair of residual assembly electrodes may include: a first residual assembly electrode protruding toward the semiconductor light-emitting diodes on the side of the data wire; and a second residual assembly electrode protruding toward the semiconductor light-emitting diodes on the side of the power wire.

According to the present disclosure, the step (a) may include forming a first insulating layer covering the data wire and the gate wire, the step (b) may include forming a second insulating layer covering the assembly electrode, and the step (c) may include seating the semiconductor light-emitting diode in a preset position and then forming a third insulating layer covering the semiconductor light-emitting diode.

According to the present disclosure, the step of forming a third insulating layer may be carried out after masking an area of overlap between the data wire and the assembly electrode and an area of overlap between the power wire and the assembly electrode.

According to the present disclosure, the step (d) may include: selectively etching the second insulating layer which is formed in the area of overlap between the data wire and the assembly electrode and the area of overlap between the power wire and the assembly electrode; and etching the extension of the assembly electrode which overlaps either the data wire or the power wire.

Advantageous Effects of Invention

A display device according to the present disclosure has the effect of leaving a final structure that only includes a pair of residual assembly electrodes by removing an extension of an assembly electrode that overlaps a data wire or a power wire, and therefore reducing parasitic capacitance created by the overlap between the assembly electrode and the data wire or the power wire, thereby enabling stable operation.

Furthermore, a display device according to the present disclosure has a structure in which an assembly electrode is added onto an active matrix-type panel, and provides efficiency in terms of the manufacturing method, since employs an existing active matrix-panel manufacturing method and does not require semiconductor light-emitting diodes to be temporarily transferred onto a separate substrate.

MODE FOR THE INVENTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the implementation described herein can be applied as long as it can include a display even in a new product form to be developed later.

Figure 1:
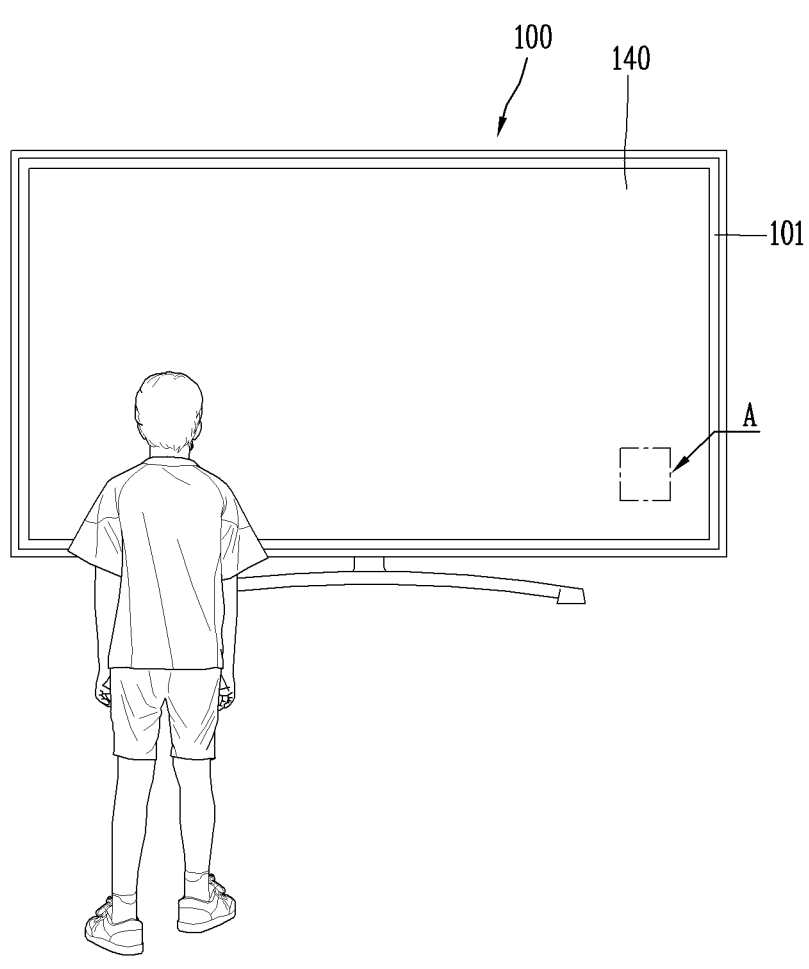
FIG. 1 is a conceptual view illustrating one implementation of a display device using semiconductor light-emitting elements.
Figure 2:
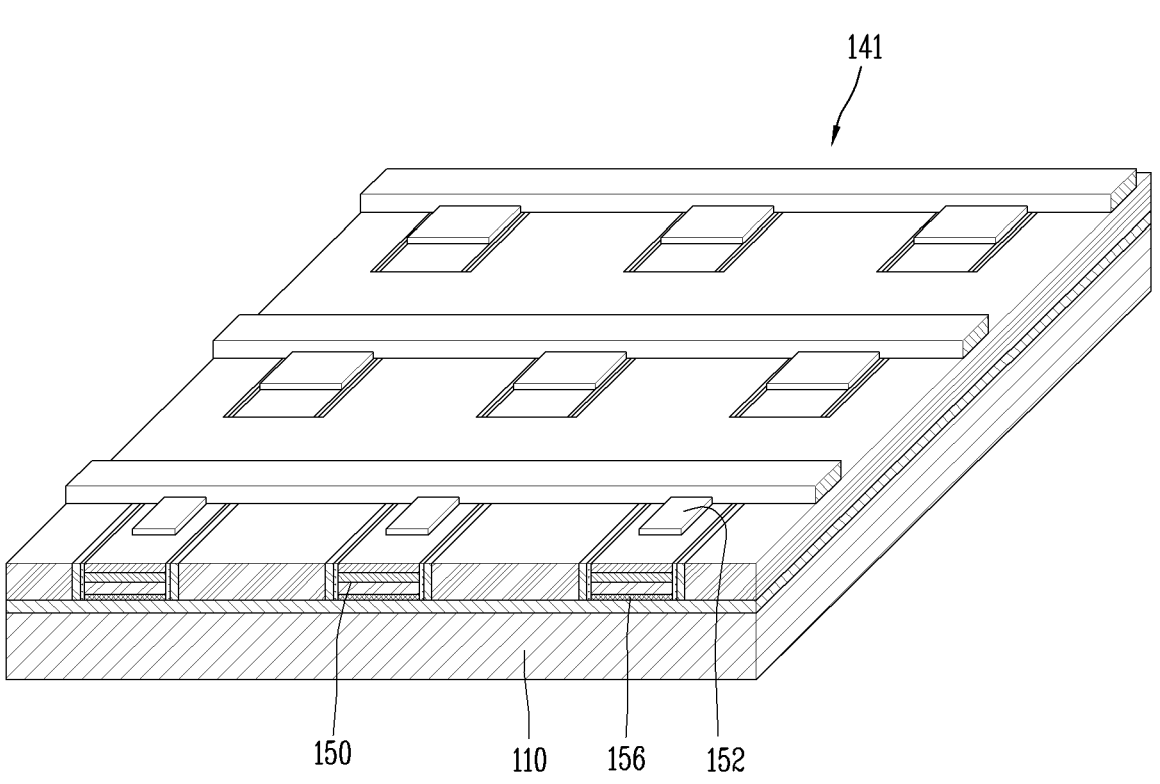
FIG. 2 is a partial enlarged view of the portion A in the display device of FIG. 1.
Figure 3:
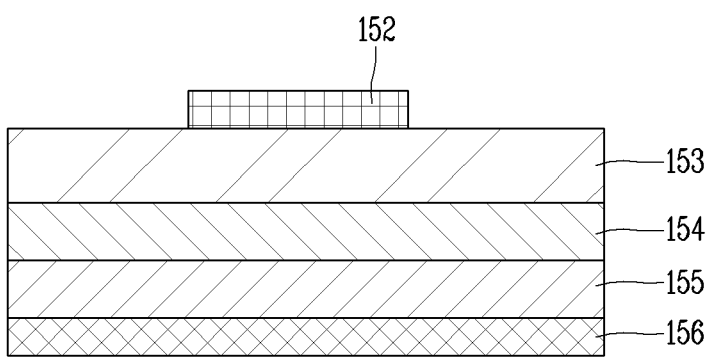
FIG. 3 is an enlarged view of the semiconductor light-emitting element of FIG. 2.
Figure 4:
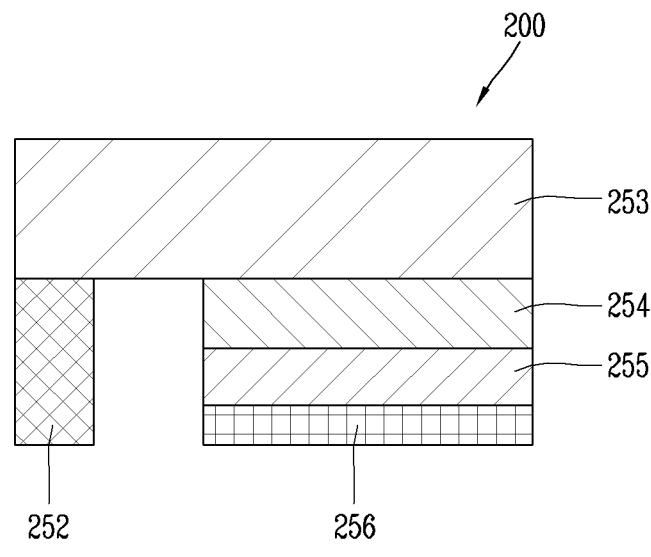
FIG. 4 is an enlarged view illustrating another implementation of the semiconductor light-emitting element of FIG. 2.

FIG. 1 is a conceptual view illustrating one implementation of a display device using semiconductor light-emitting elements (or diodes), FIG. 2 is a partial enlarged view of the portion A in the display device of FIG. 1, FIG. 3 is an enlarged view of the semiconductor light-emitting element of FIG. 2, and FIG. 4 is an enlarged view illustrating another implementation of the semiconductor light-emitting element of FIG. 2.

As illustrated, information processed by a controller of a display device 100 may be output on a display module 140. A closed loop-shaped case 101 that runs around the edge of the display module 140 may define the bezel of the display device.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels (sub-pixels) arranged in a matrix configuration independently through the wirings.

The present disclosure takes microLEDs (light-emitting diodes) as an example of the semiconductor light-emitting elements 150 which convert current into light. The microLEDs may be light-emitting elements that are small in size less than 100 micron meters. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, each of the semiconductor light-emitting elements 150 may be implemented with a high-power light emitting device that emits various lights including blue in which gallium nitride (GaN) is mostly used, and indium (In) and or aluminum (Al) are added thereto.

The vertical type semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom may be electrically connected to a p-electrode of the wiring substrate, and the upper n-type electrode 152 at the top may be electrically connected to an n-electrode above the semiconductor light-emitting element. The electrodes can be disposed in an upward/downward direction in the vertical semiconductor light-emitting element 150, thereby providing a great advantage of reducing a chip size.

In another example, referring to FIG. 4, the semiconductor light-emitting elements may be flip chip-type light-emitting elements.

As an example of such a flip chip-type light-emitting element, the semiconductor light-emitting element 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a horizontal light-emitting element each may be used as a green semiconductor light-emitting element, blue semiconductor light-emitting element, or red semiconductor light-emitting element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example, the semiconductor light-emitting elements may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting element, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. In this case, the micro-sized semiconductor light-emitting elements 150 should be transferred onto a wafer, at preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) type semiconductor light-emitting elements will be illustrated. However, an example described below may also be applicable to an active matrix (AM) type semiconductor light-emitting element. Also, although the illustration will be given of how horizontal semiconductor light-emitting elements are self-assembled, it may also be applied to self-assembling of vertical semiconductor light-emitting elements.

Figure 5A:
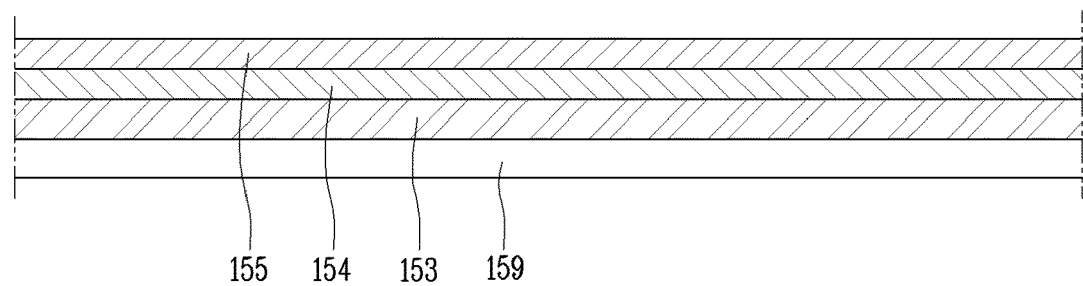
FIGS. 5A to 5E are conceptual diagrams illustrating a new process for manufacturing the semiconductor light-emitting element.

First of all, according to the manufacturing method, a first conductive semiconductor layer 153, an active layer 154, and a second conductive semiconductor layer 155 may be grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a p-type semiconductor layer, and the second conductive semiconductor layer 155 may be an n-type semiconductor layer. However, the present invention is not necessarily limited thereto, and may employ an example in which the first conductive electrode is the n-type and the second conductive electrode is the p-type.

Moreover, although this exemplary implementation is illustrated by assuming the presence of the active layer, the active layer may be omitted if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. In addition, the growth substrate 1059 may be made of a material suitable for growing a semiconductor material, namely, a carrier wafer. The growth substrate 2101 may also be formed of a material having high thermal conductivity. The growth substrate 2101 may use at least one of a SiC substrate having higher thermal conductivity than the sapphire (Al2O3) substrate, Si, GaAs, GaP, InP and Ga2O3, in addition to a conductive substrate or an insulating substrate.

Figure 5B:
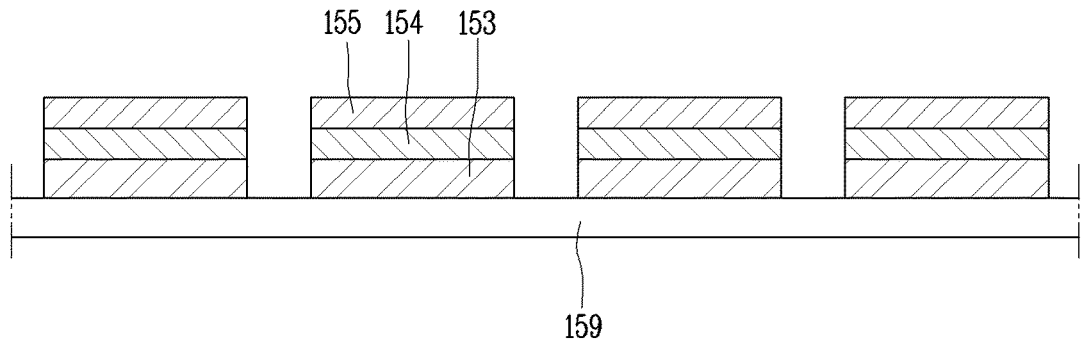

Next, a plurality of semiconductor light-emitting elements may be formed by removing at least parts of the first conductive semiconductor layer 153, the active layer 154, and the second conductive semiconductor layer 155 (FIG. 5B).

More specifically, isolation may be performed so that the plurality of light-emitting elements form a light-emitting diode array. That is, a plurality of semiconductor light-emitting elements may be formed by vertically etching the first conductive semiconductor layer 153, the active layer 154, and the second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
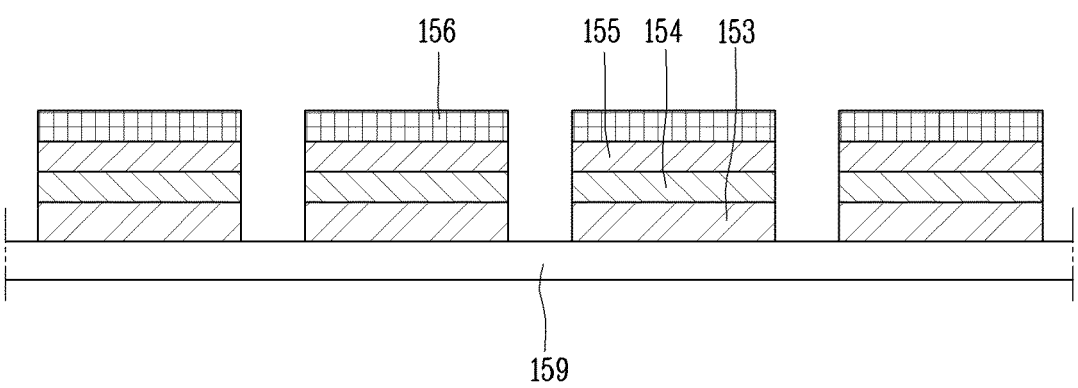

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
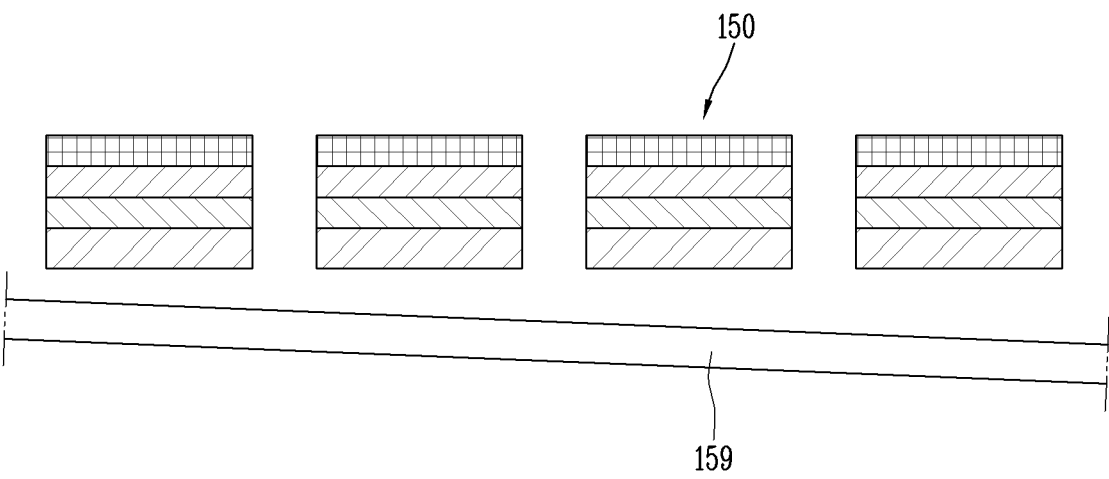

Next, the growth substrate 159 may be removed, thus leaving a plurality of semiconductor light-emitting elements. For example, the growth substrate 1059 may be removed using laser lift-off (LLO) or chemical lift-off (CLO) (FIG. 5D).

Figure 5E:
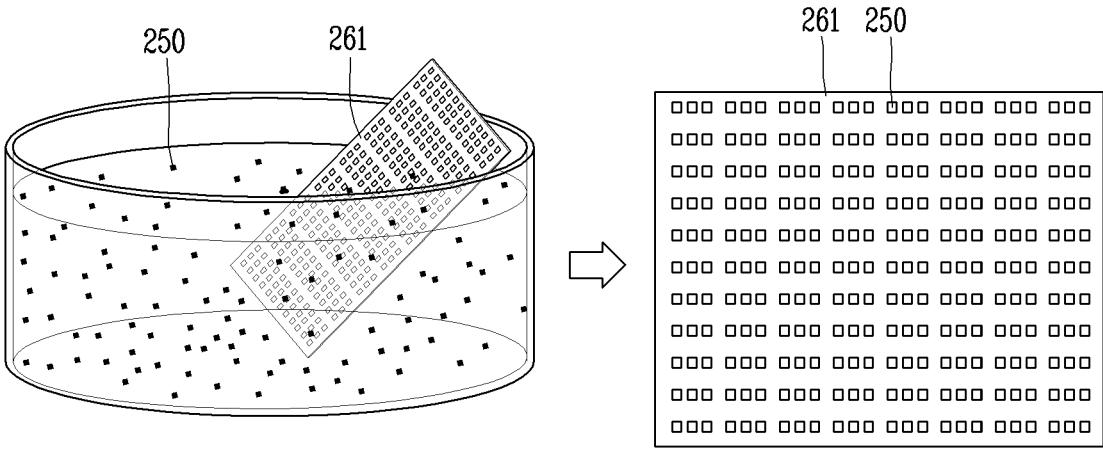

Afterwards, the step of mounting the semiconductor light-emitting elements 150 on a substrate in a chamber filled with a fluid may be performed (FIG. 5E).

For example, the semiconductor light-emitting elements 150 and the substrate 161 may be put into a chamber filled with a fluid, and the semiconductor light-emitting elements may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting elements 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting elements 150 onto the assembly substrate 161, cells (not shown) into which the semiconductor light-emitting elements 150 are fitted may be provided on the assembly substrate 161. Specifically, cells where the semiconductor light-emitting elements 150 are mounted may be disposed on the assembly substrate 161 at positions where the semiconductor light-emitting elements 150 are aligned to with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting elements so that the semiconductor light-emitting elements are moved by magnetic force, and the semiconductor light-emitting elements may be mounted at preset positions by an electric field in the process of being moved. This transfer method and device will be described in more detail below with reference to the accompanying drawings.

Figure 6:
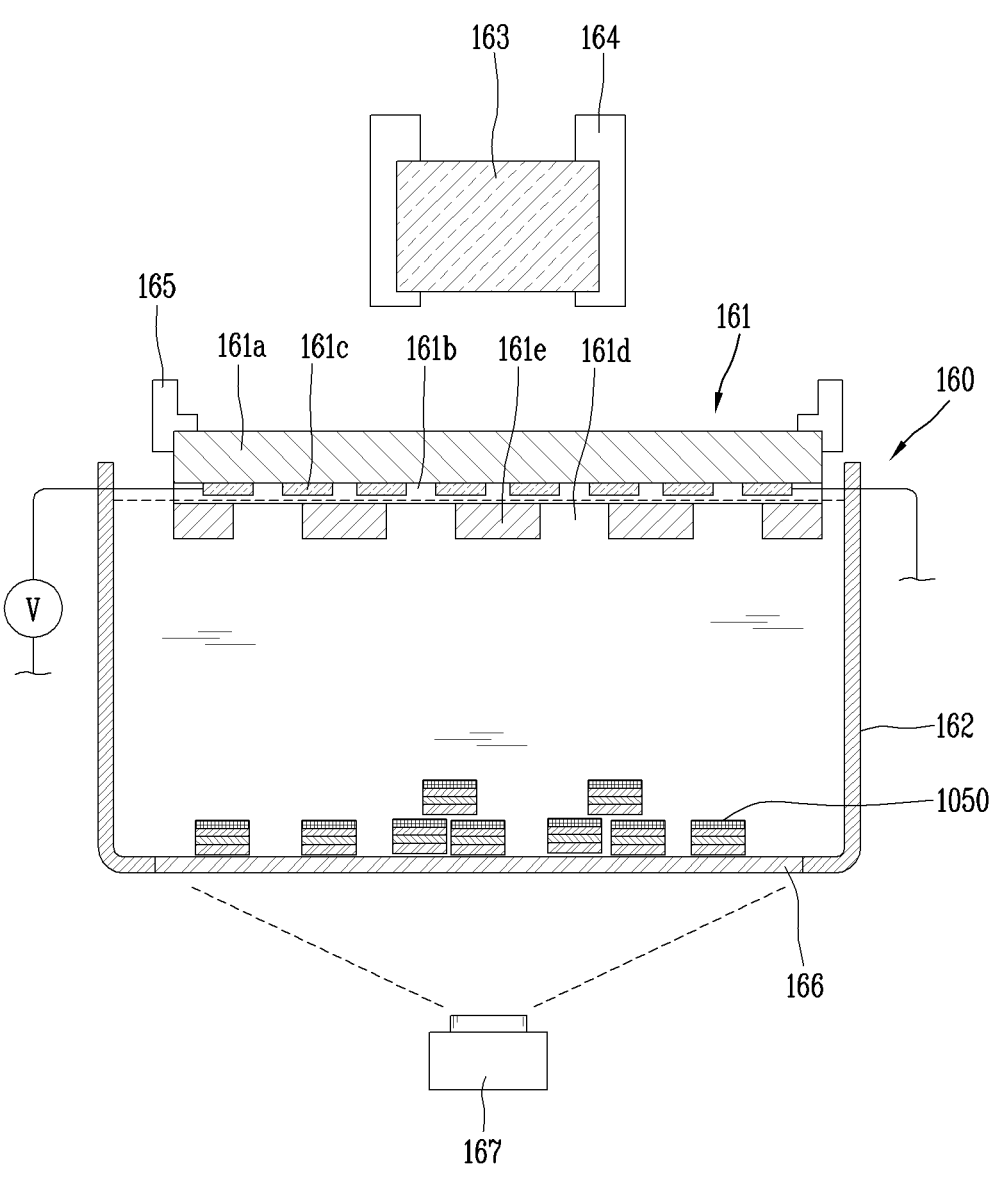
FIG. 6 is a conceptual diagram illustrating an example of a device for self-assembling semiconductor light-emitting elements.
Figure 7:
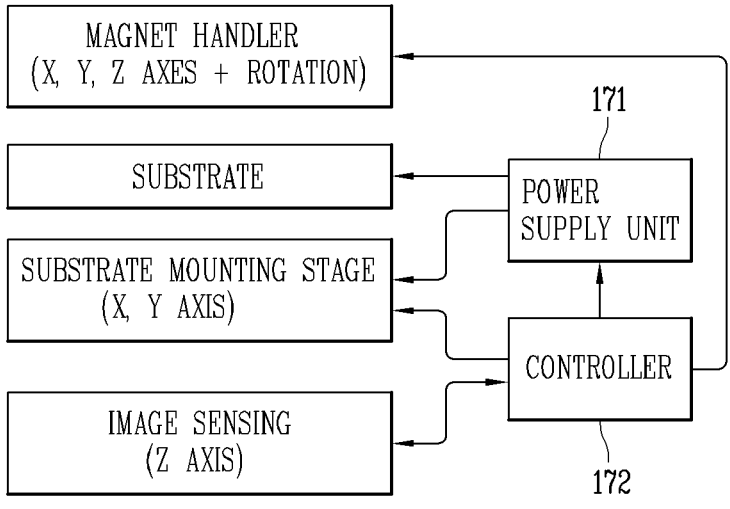
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161a, a dielectric layer 161b, and a plurality of electrodes 161c.

The base portion 161a may be made of an insulating material, and the plurality of electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b is made of an inorganic material such as SiO2, SiNx, SiON, Al2O3, TiO2, HfO2, or the like. Alternatively, the dielectric layer 161b may be made of a single layer or multiple layers as an organic insulator. A thickness of the dielectric layer 161b may be several tens of nanometers (nm) to several micrometers (μm).

In addition, the substrate 161 may include a plurality of cells 161d that are partitioned by barrier walls. The cells 161d may be sequentially arranged in one direction and made of a polymer material. Furthermore, the barrier walls 161e defining the cells 161d may be made to be shared with neighboring cells 161d. The barrier walls 161e may protrude from the base portion 161a, and the cells 161d may be sequentially arranged in one direction by the barrier walls 161e. More specifically, the cells 161d may be sequentially arranged in column and row directions and have a matrix configuration.

As illustrated in the drawings, the cells 161d may have recesses for receiving the semiconductor light-emitting elements 150, and the recesses may be spaces defined by the barrier walls 161e. The recesses may have a shape identical or similar to the shape of the semiconductor light-emitting elements. For example, if the semiconductor light-emitting elements are rectangular, the recesses may be rectangular too. In addition, although not shown, when the semiconductor light-emitting element has a circular shape, grooves formed inside the cells may be formed in a circular shape. Moreover, each of the cells is configured to accommodate a single semiconductor light-emitting element. In other words, a single semiconductor light-emitting element is accommodated in a single cell.

Meanwhile, the plurality of electrodes 161c may have a plurality of electrode lines that are placed on bottoms of the cells 161d, and the plurality of electrode lines may extend to neighboring cells.

The plurality of electrodes 161c may be placed beneath the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c beneath each cell 161d, an electric field may be formed and the semiconductor light-emitting elements can be inserted into the cells 161d by the electric field.

The electrodes of the substrate 161 at the assembly site may be electrically connected to a power supply unit 171. The power supply unit 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting diode may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056a and a second layer 1056b, as illustrated in FIG. 9. Here, the first layer 1056a may include a magnetic material, and the second layer 1056b may include a metal material other than the magnetic material.

As illustrated in the drawing, in this example, the first layer 1056a including the magnetic material may be disposed in contact with the second conductive semiconductor layer 1055. In this case, the first layer 1056a may be disposed between the second layer 1056b and the second conductive semiconductor layer 1055. The second layer 1056b may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
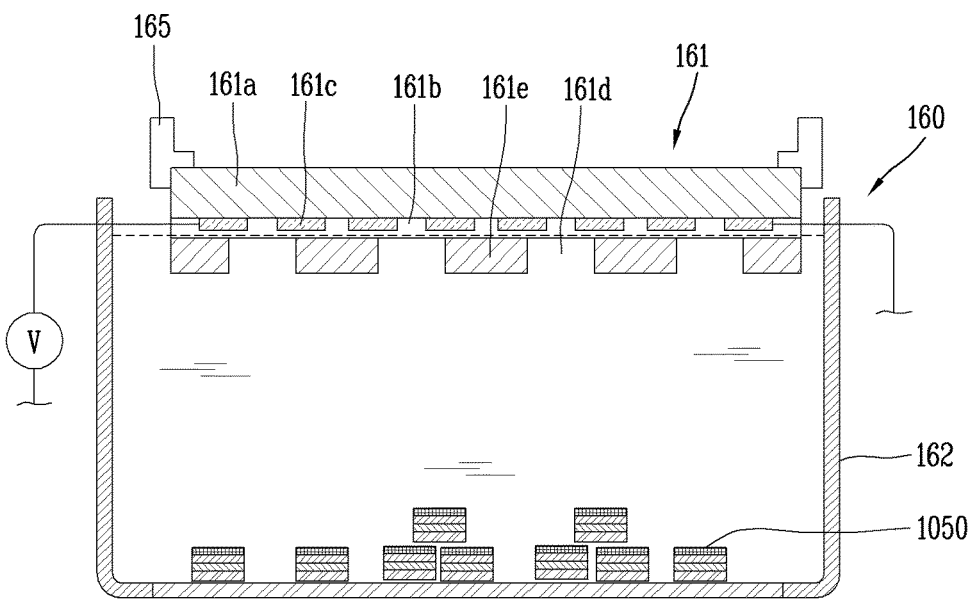
FIGS. 8A to 8E are conceptual view illustrating a process for self-assembling semiconductor light-emitting elements using the self-assembly device of FIG. 6.
Figure 9:
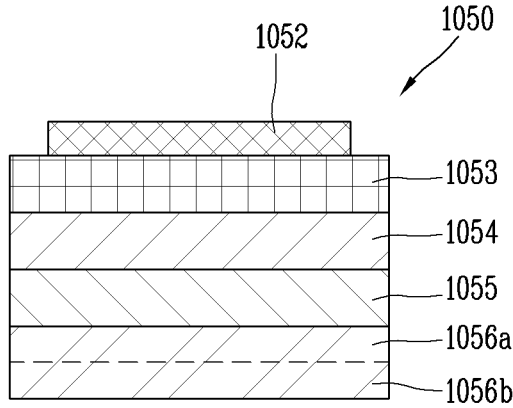
FIG. 9 is a conceptual view illustrating the semiconductor light-emitting element of FIGS. 8A to 8E.

Next, the substrate 161 may be fed to an assembly site, and the semiconductor light-emitting elements 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. When the fluid chamber 162 is provided with the light-transmissive bottom plate 166, some of the semiconductor light-emitting elements 1050 may sink to the bottom plate 166.

Figure 8B:
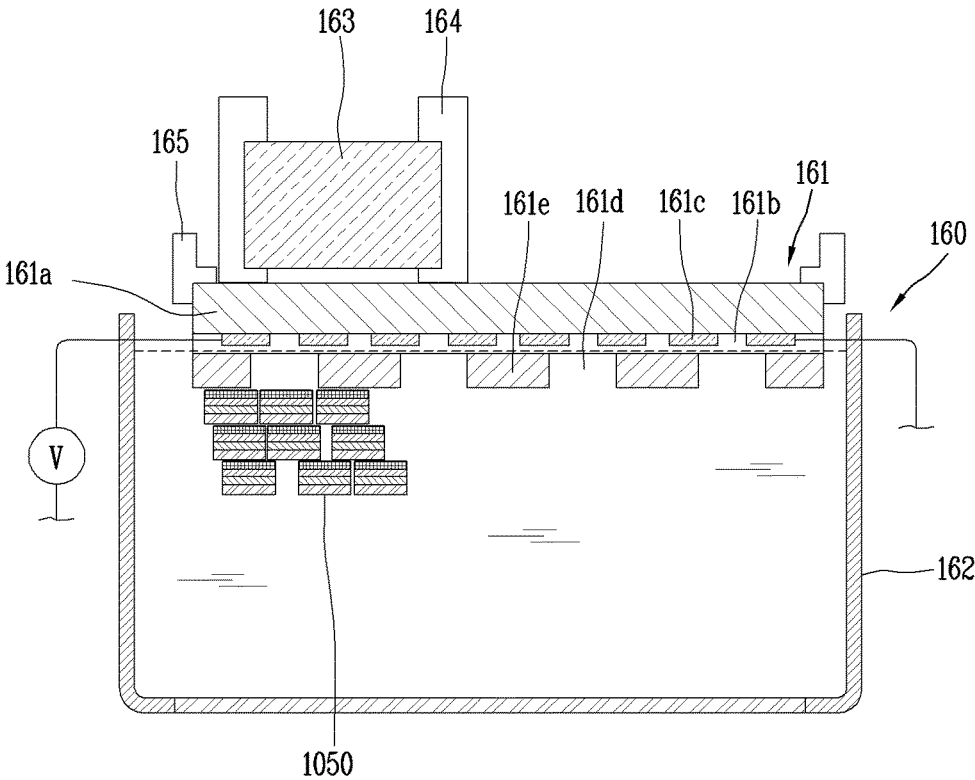

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this implementation, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
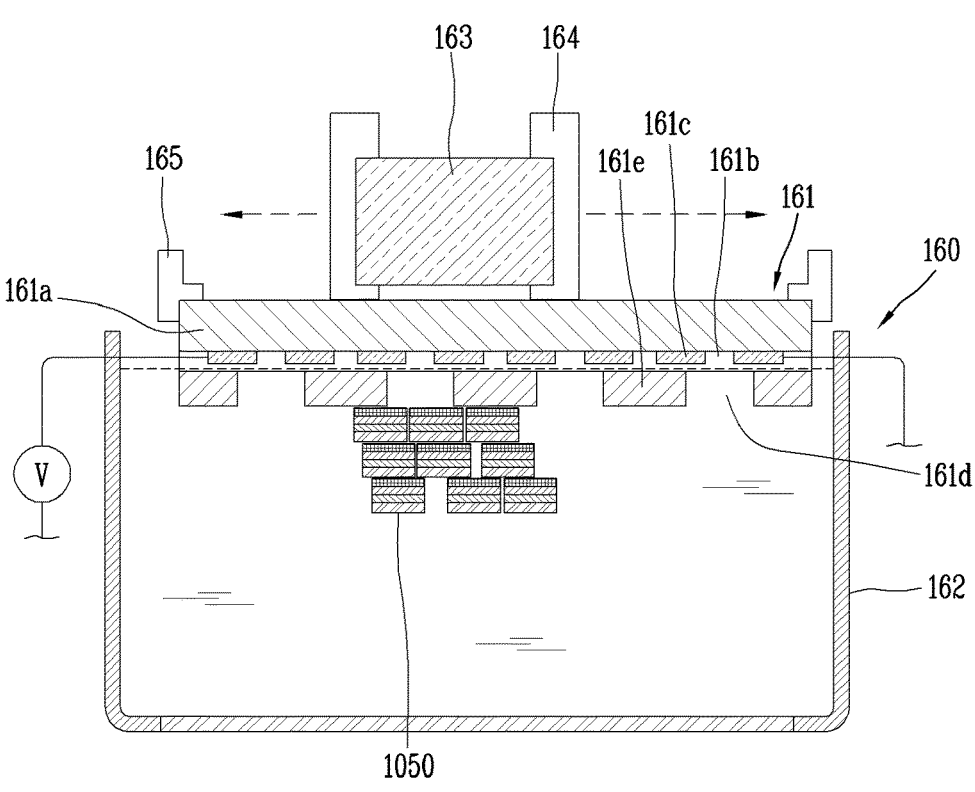

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
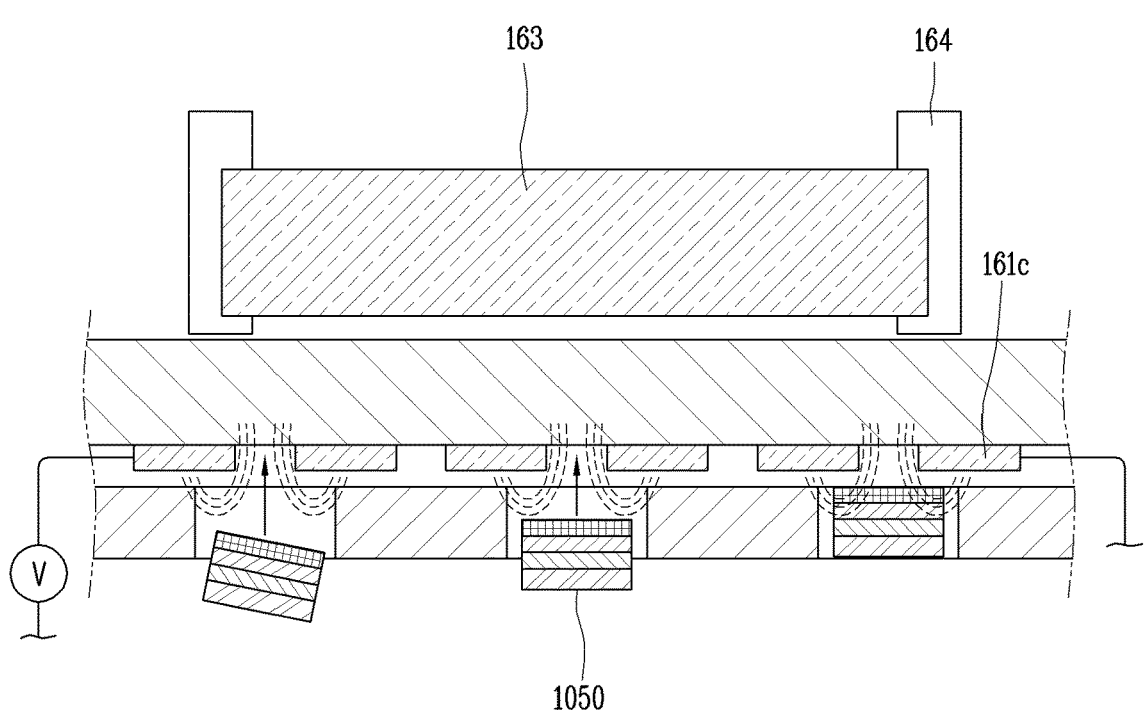
Figure 8E:
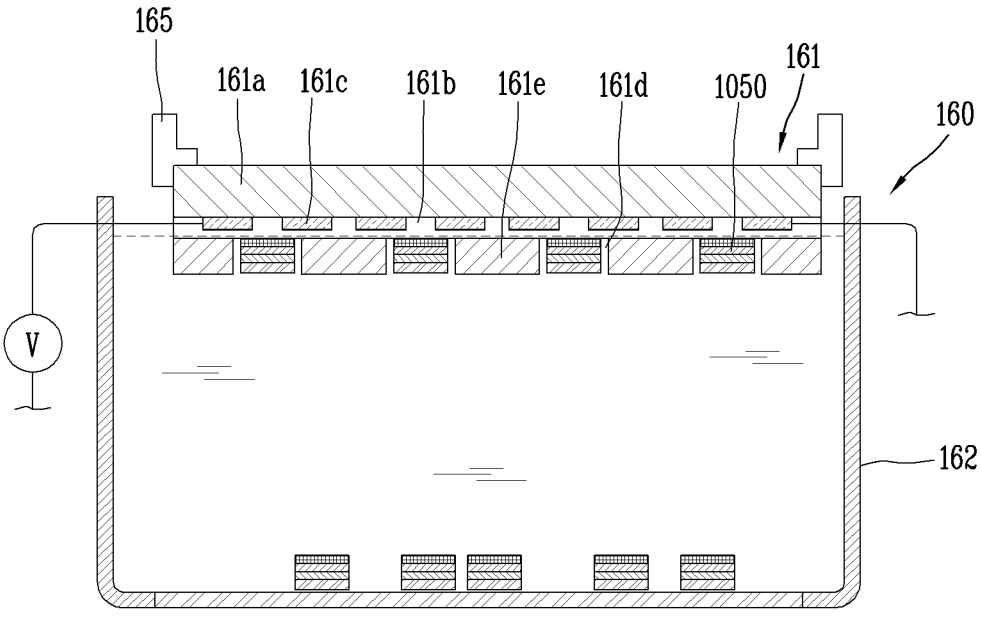

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

Hereinafter, a display device using semiconductor light-emitting elements having a novel structure according to an implementation will be described with reference to the accompanying drawings.

A display device 2000 according to an embodiment of the present disclosure is an active matrix-type (hereinafter, AM-type) display device including an assembly electrode 2060 as a structure for self-assembling semiconductor light-emitting diodes—more specifically, including a pair of residual assembly electrodes 2061 and 2062 as part of the assembly electrodes.

Figure 10:
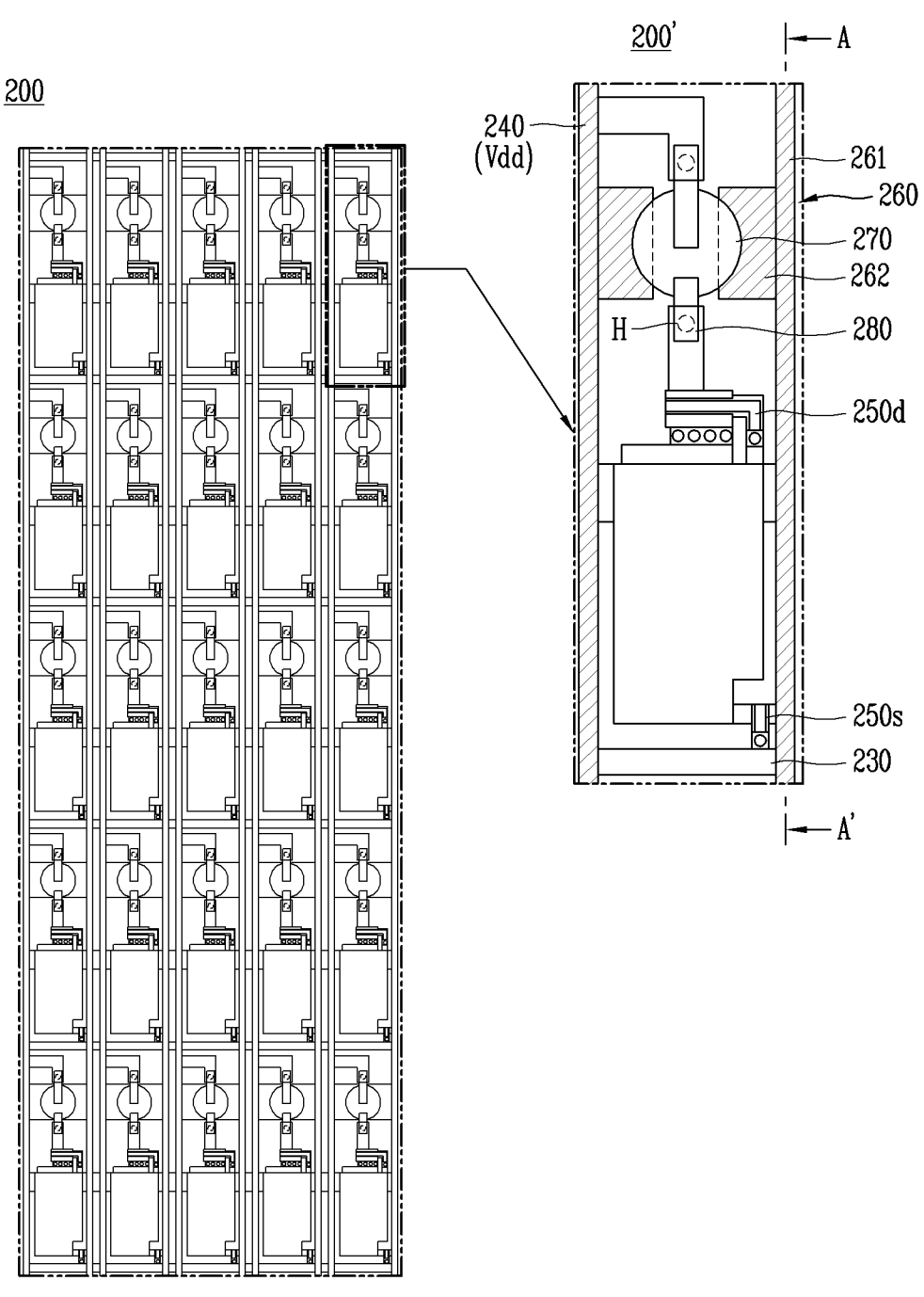
FIG. 10 is a conceptual diagram showing a structure in which assembly electrodes are added to a conventional active matrix-type display panel.
Figure 11:
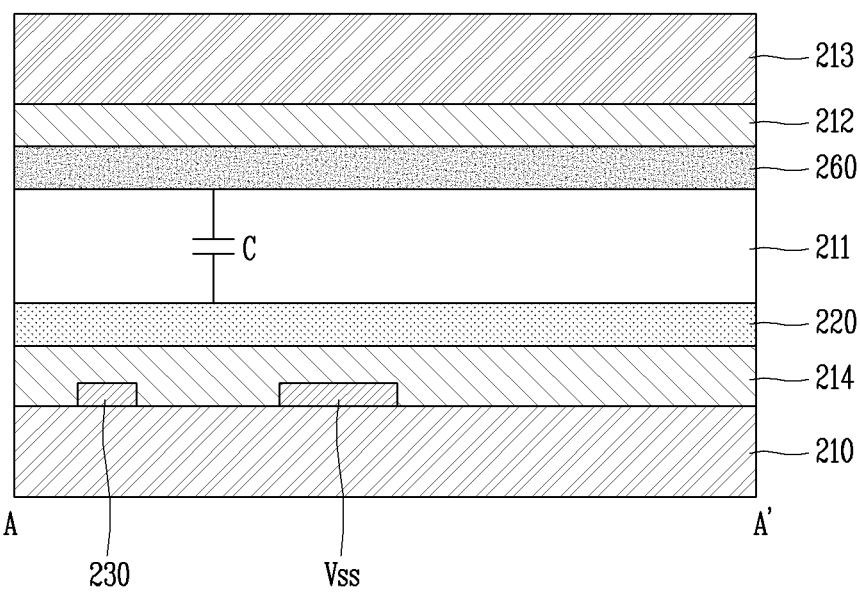
FIG. 11 is a cross-sectional view taken along the line A-A' of FIG. 10.
Figure 12:
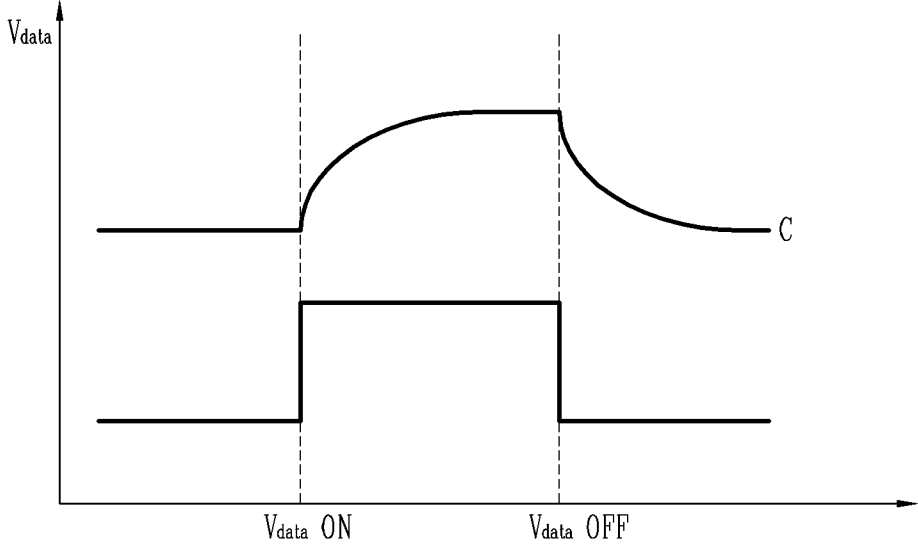
FIG. 12 is a graph showing measurements of parasitic capacitance in the structure of FIG. 11.

FIG. 10 is a conceptual diagram showing a structure in which assembly electrodes are added to a conventional active matrix-type display panel. FIG. 11 is a cross-sectional view taken along the line A-A' of FIG. 10. FIG. 12 is a graph showing measurements of parasitic capacitance in the structure of FIG. 11.

The AM-type display device (or display device) 200 may have a data wire 220 and a gate wire 230 arranged on a base unit 210. The data wire 220 and the gate wire 230 may extend in different directions and intersect each other.

The base unit 210 may further include wires Vss and Vdd. The Vdd wire (hereinafter, a power wire 240) may extend in the same direction as the data wire 220.

Thin-film transistors (a switching thin-film transistor 250s and a driving thin-film transistor 250d) and a storage capacitor, including a semiconductor light-emitting diode 270, may be disposed in an area defined by an intersection of the data wire 220 and the gate wire 230 of each unit pixel 200'.

The thin-film transistors 250 each include a gate electrode, an active layer, a source electrode, and a drain electrode, and may be classified into a-Si type and LTPS type whose active layer is formed of silicon and oxide type whose active layer is formed of oxide, depending on the material of the active layer. Among them, the oxide type is suitable for large-sized displays such as PCs and TVs, since its active layer is formed of an IGZO (indium, gallium, zinc, and oxygen) compound.

The semiconductor light-emitting diode 270 may be electrically connected to the thin-film transistors 250 by a connecting electrode 280. The connecting electrode 280 may be formed to extend from an electrode of the semiconductor light-emitting diode 270 and fill a via hole H exposing the gate electrode or drain electrode of a thin-film transistor 250 and electrically connect the semiconductor light-emitting diode 270 and the thin-film transistor 250.

Conventionally, in order to assembly a semiconductor light-emitting diode 270 that is several to several tens of μm in size to an AM-type display device 200, a semiconductor light-emitting diode 270 is assembled through self-assembly to a donor substrate with assembly electrodes formed on it, and then the semiconductor light-emitting diode 270 is transferred from an assembly substrate to a substrate with thin-film transistors 250 and wires formed on it, by using PDMS stamps.

Meanwhile, in order to self-assemble a semiconductor light-emitting diode 270 to a substrate with thin-film transistors 250 and wires formed on it, an assembly electrode 260 needs to be added to receive a voltage signal for forming an electrical field, in which case it is necessary for the assembly electrode 260 to extend in the same direction as the data wire 220 and the power wire 240. Accordingly, the assembly electrode 260 may overlap the data wire 220 (or the power wire 240), with an insulating layer 211 formed of a dielectric material interposed in between. Additional insulating layers 212, 213 and 214 may be provided.

However, such a structure is problematic in that it forms very high parasitic capacitance C between the assembly electrode 260 and the data wire 220 or the power wire 240 (see the graph of FIG. 12).

The parasitic capacitance C causes RC delay, and distorts the waveform of the data wire 220, thus deteriorating the operational stability of the display device. Specifically, when a voltage is applied to the data wire 220, the assembly electrode 260 overlapping the data wire 220 electrically floats, and the voltage of the assembly electrode 260 continuously changes with the voltage of the data wire 220. Thus, the capacitance also changes and therefore the operational stability of the display device 200 is deteriorated.

The present disclosure relates to an AM-type display device 2000 capable of operating stably even if assembly electrodes for self-assembly are added.

Figure 13:
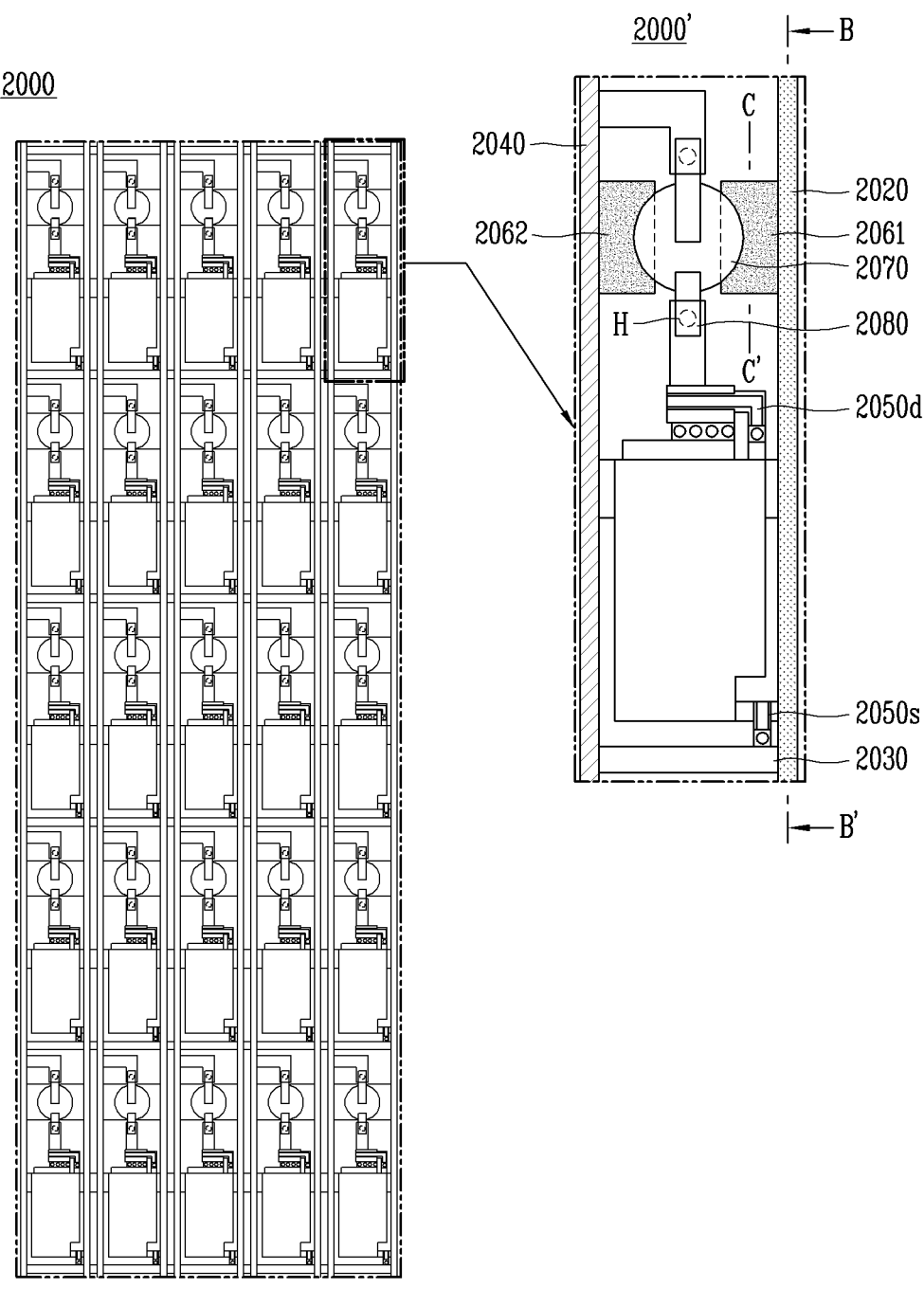
FIG. 13 is a conceptual diagram showing a structure of an active matrix-type display panel according to the present disclosure.
Figure 14:
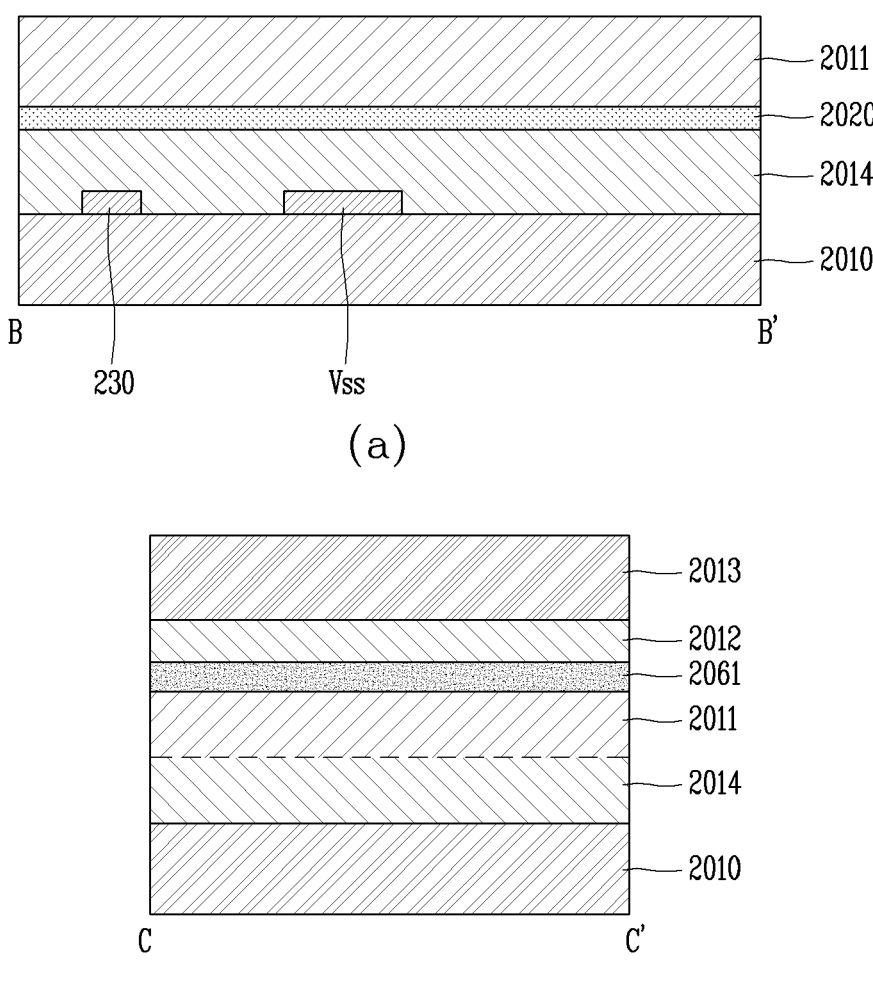
FIG. 14 is a cross-sectional view taken along the line B-B' and line C-C" of FIG. 13.

FIG. 13 is a conceptual diagram showing a structure of an active matrix-type display panel according to the present disclosure. FIG. 14 is a cross-sectional view taken along the line B-B' and line C-C" of FIG. 13.

Referring to FIG. 13, the display device 2000 according to the present disclosure may include a data wire 2020, a gate wire 2030, a power wire 2040, thin-film transistors 2050, a pair of residual assembly electrodes 2061 and 2062, and a semiconductor light-emitting diode 2070, which are disposed on a base unit 2010 for each unit pixel 2000'.

The base unit 2010 may include polyimide PI to achieve flexibility, and its material is not specifically limited as long as it provides insulation and flexibility.

The data wire 2020 and the gate wire 2030 may be disposed to intersect each other on the base unit 2010. The data wire 2020 and the gate wire 2030 may be arranged in columns and rows and intersect each other, and may be separated by an insulating layer 2014.

The power wire 2040 extending in the same direction as the data wire 2020 may be disposed on the base unit 2010. The power wire 2040 may be disposed between two adjacent data wires 2020, much closer to one of the two adjacent data wires 2020.

Thin-film transistors 2050 and a storage capacitor, including a semiconductor light-emitting diode 2070, may be disposed in an area defined by an intersection of the data wire 2020 and the gate wire 2030.

The thin-film transistors 250 may be connected to the data wire 2020 and the gate wire 2030. The semiconductor light-emitting diode 2070 may operate in connection with the thin-film transistors 2050. The thin-film transistors 2050 may include a switching thin-film transistor 2050s and a driving thin-film transistor 2050d. Meanwhile, the switching thin-film transistor 2050s and the driving thin-film transistor 2050d have the same structure and the same manufacturing process, which is a well-known technology, so a detailed description thereof will be omitted.

According to the present disclosure, the semiconductor light-emitting diode 2070 may be a horizontal semiconductor light-emitting diode 2070 with p-type and n-type electrodes formed on one side. The semiconductor light-emitting diode 2070 may be connected to the switching thin-film transistor 2050s and the driving thin-film transistor 2050d.

The semiconductor light-emitting diode 2070 and the thin-film transistors 2050 may be electrically connected by a connecting electrode 2080. The connecting electrode 2080 may be formed to extend from the p-type and n-type electrodes of the semiconductor light-emitting diode 2070 and fill a via hole H exposing the gate electrode or drain electrode of a thin-film transistor 2050 and electrically connect the semiconductor light-emitting diode 2070 and the thin-film transistor 2050.

According to the present disclosure, a pair of residual assembly electrodes 2061 and 2062 may be disposed in an area defined by an intersection of the data wire 2020 and the gate wire 2030. The pair of residual assembly electrodes 2061 and 2062 may overlap the semiconductor light-emitting diode 2070. The pair of residual assembly electrodes 2061 and 2062 may be part of the assembly electrode 2060 added to self-assemble the semiconductor light-emitting diode 2070.

According to the present disclosure, the pair of residual assembly electrodes 2061 and 2062 may be formed in such a way as not to overlap the data wire 2020 and the power wire 2040. Specifically, in the present disclosure, the assembly electrode 2060 may be formed to include an extension 261 extending in the same direction as the data wire 2020 or the power wire 2040 and overlapping the same and a protrusion 262 protruding toward the semiconductor light-emitting diode 2070 without overlapping the data wire 2020 or the power wire 2040, as shown in FIG. 10. After the self-assembly process, the extension 261 overlapping the data wire 2020 and the power wire 2040 may be removed.

The pair of residual assembly electrodes 2061 and 2062 may correspond to the protrusion 262 of the assembly electrode 2060 which does not overlap the data wire 2020 and the power wire 2040.

That is, according to the present disclosure, the final display device 200 will only have the pair of residual assembly electrodes 2061 and 2062 left on it, which corresponds to the protrusion 262 not overlapping the data wire 2020 and the power wire 2040. This eliminates or greatly reduces the parasitic capacitance formed when the display device 2000 is operated.

The pair of residual assembly electrodes 2061 and 2062 may include a first residual assembly electrode 2061 protruding toward the semiconductor light-emitting diode 2070 on the side of the data wire 2020 and a second residual assembly electrode 2062 protruding toward the semiconductor light-emitting diode 2070 on the side of the power wire 2040.

Meanwhile, according to the present disclosure, a first insulating layer 2011 may be included which is disposed between the data wire 2020 and the power wire 2040 and the pair of residual assembly electrodes 2061 and 2062. The first insulating layer 2011 may be for electrically separating the assembly electrode 2060 or the pair of residual assembly electrodes 2061 and 2062 from the data wire 2020 and the power wire 2040. The first insulating layer 2011 may be formed of an inorganic insulating material such as SiO2, SiNx, SiON, Al2O3, TiO2, HfO2, etc., but not limited thereto.

Moreover, according to the present disclosure, a second insulating layer 2012 may be included which is disposed between the pair of residual assembly electrodes 2061 and 2062 and the semiconductor light-emitting diode 2070. The second insulating layer 2012 may be formed on the entire surface of the substrate, but may be left only in some area in the end. The second insulating layer 2012 may be formed of an inorganic insulating material such as SiO2, SiNx, SiON, Al2O3, TiO2, HfO2, etc., but not limited thereto.

Moreover, according to the present disclosure, a third insulating layer 2013 may be included which is formed to cover the semiconductor light-emitting diode 2070. The third insulating layer 2013 may be a layer for planarizing one surface of a substrate while filling space between semiconductor light-emitting diodes 2070, and may be formed on some area of the substrate. The third insulating layer 2013 may have a thickness of several to several tens of μm, and be formed of an organic insulating material, for example. The third insulating layer 2013 may include a hole exposing part of the p-type and n-type electrodes of the semiconductor light-emitting diode 2070.

According to the above-described structure including the first to third insulating layers 2011, 2012, and 2013, the data wire 2020 and the power wire 2040 may include a first area 2020a overlapping the first insulating layer 2011 and a second area 2020b overlapping the first insulating layer 2011, the second insulating layer 2012, and the third insulating layer 2013.

Next, a method for manufacturing the above-described AM-type display device 2000 will be described with reference to FIGS. 15 and 16.

Figure 15:
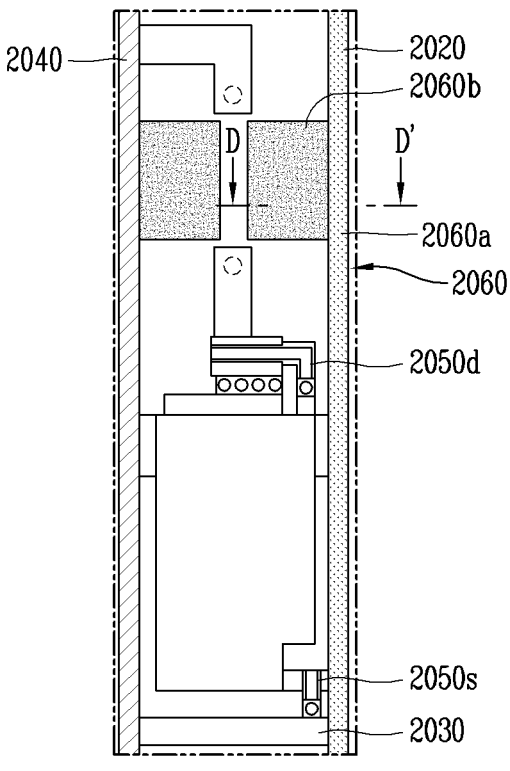
FIG. 15 is a conceptual diagram showing the semiconductor light-emitting diode of FIG. 13 in a non-assembled state.
Figure 16A:
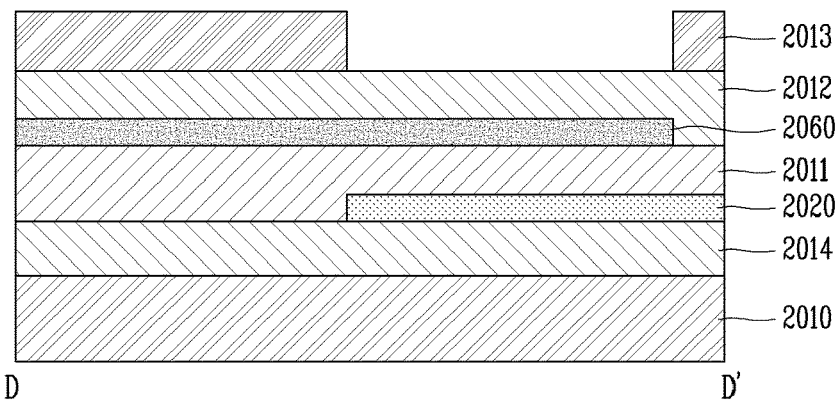
FIGS. 16A to 16C are conceptual diagrams for explaining a process of manufacturing a structure in which an assembly electrode, a data wire, and a power wire do not overlap.
Figure 16B:
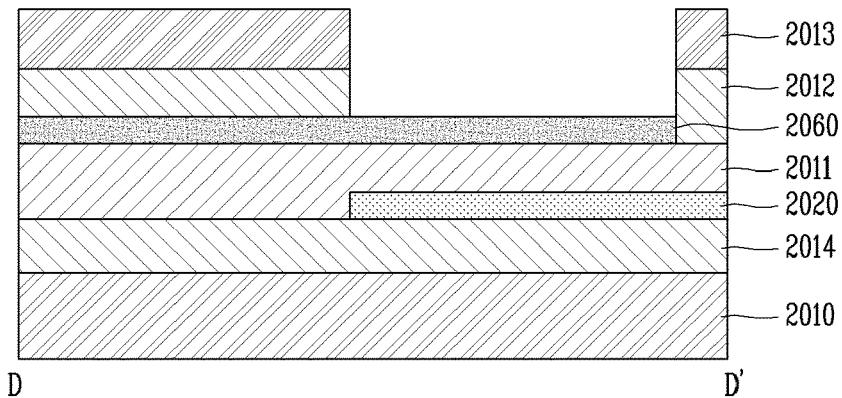
Figure 16C:
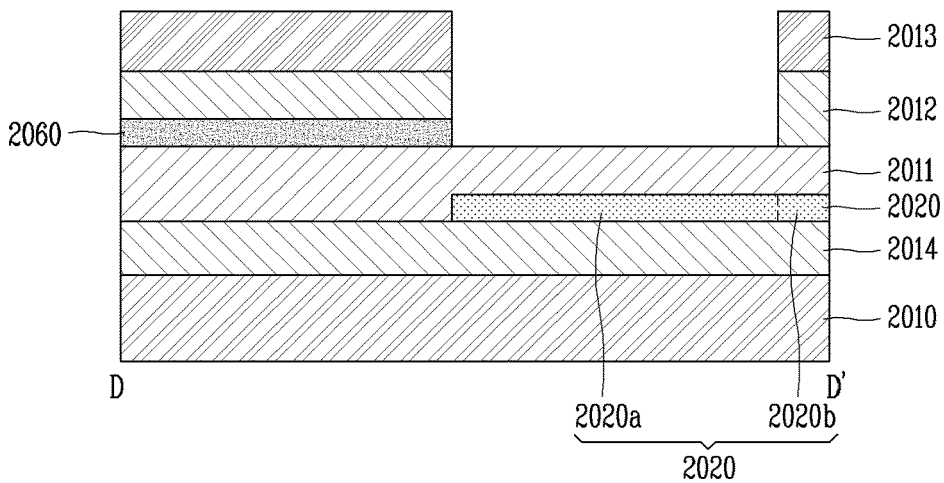

FIG. 15 is a conceptual diagram showing the semiconductor light-emitting diode of FIG. 13 in a non-assembled state. FIGS. 16A to 16C are conceptual diagrams for explaining a process of manufacturing a structure in which an assembly electrode, a data wire, and a power wire do not overlap.

First, a step (a) of forming a plurality of wires and thin-film transistors 2050 on a base unit 2010 may be performed. Specifically, a data wire 2020 and a gate wire 2030 may be formed on a base unit 2010 and arranged in columns and rows, respectively, on the base unit 2010 and intersect each other, and a power wire 2040 may be formed to extend in the same direction as the data wire 2020. Also, the thin-film transistors 2050 may be formed to be connected to the data wire 2020 and the gate wire 2030.

For example, the step (a) may be carried out by sequentially performing a step of forming a gate wire 2030 and a gate electrode on a base unit 2010, a step of forming a gate insulating film, a step of forming an active layer and an ohmic contact layer, a step of forming a data wire and a power wire, and a step of forming a source electrode and a drain electrode.

Also, the step (a) may include a step of forming a first insulating layer 2011 covering the data wire 2020 and the power wire 2040, and the first insulating layer 2011 may be formed of an inorganic insulating material.

Next, a step (b) of forming an assembly electrode 2060 in such a way as to extend in the same direction as the data wire 2020, with an extension overlapping either the data wire 2020 or the power wire 2040. The assembly electrode 2060 may be formed on the first insulating layer 2011.

The assembly electrode 2060 may include an extension 2060a overlapping either the data wire 2020 or the power wire 2040 and a protrusion 2060b protruding from the extension 2060a and not overlapping the data wire 2020 or the power wire 2040.

The assembly electrode 2060 may be formed of a non-resistant metal such as Al, Mo, Cu, Ag, or Ti or an alloy composed of two or more types of non-resistant metal. Also, the assembly electrode 2060 may have a thickness of several or several tens of nm.

Moreover, the step (b) may include a step of forming a second insulating layer 2012 covering the assembly electrode 2060, and the second insulating layer 2012 may be formed of an inorganic insulating material.

Next, a step (c) of seating a semiconductor light-emitting diode 2070 in a preset position by applying a voltage signal to the assembly electrode 2060. The semiconductor light-emitting diode 2070 may be seated on the second insulating layer 2012. Meanwhile, the step (c) may be a self-assembly process using a magnetic field and an electrical field according to FIGS. 8A to 8E, and a detailed description thereof will be omitted.

In addition, the step (c) may include a step of forming a third insulating layer 2013 covering the semiconductor light-emitting diode 2070 after seating the semiconductor light-emitting diode 2070 in a preset position. The third insulating layer 2013 may be formed of an inorganic insulating material.

The third insulating layer 2013 may be formed on some area of the substrate. Specifically, the third insulating layer 2013 may be formed in areas excluding an area of overlap between the data wire 2020 and the assembly electrode 2060 and an area of overlap between the power wire 2040 and the assembly electrode 2060. The area of overlap between the assembly electrode 2060 and the data wire 2020 or the power wire 2040 may be the extension 2060a of the assembly electrode 2060.

Accordingly, the step of forming a third insulating layer 2013 may be carried out after masking an area of overlap between the data wire 2020 and the assembly electrode 2060 and an area of overlap between the power wire 2040 and the assembly electrode 2060. According to the present disclosure, the portion of the assembly electrode 2060 that overlaps the data wire 2020 or the power wire 2040 needs to be removed in the end to prevent formation of parasitic capacitance. Thus, the third insulating layer 2013 may not be formed in this portion (FIG. 16A).

Next, a step (d) of removing the extension 2060a of the assembly electrode 2060 may be performed. The step (d) may be performed in the process of forming a via hole H and a connecting electrode 2080 to electrically connect the semiconductor light-emitting diode 2070 and the thin-film transistors 2050.

The step (d) may be carried out by sequentially performing a step (FIG. 16B) of selectively etching the second insulating layer 2012 which is formed in the area of overlap between the data wire 2020 and the assembly electrode 2060 and the area of overlap between the power wire 2040 and the assembly electrode 2060, and a step (FIG. 16C) of etching the extension 2060a of the assembly electrode 2060 which overlaps either the data wire 2020 or the power wire 2040. That is, in the step (d), the second insulating layer 2012 and the assembly electrodes 2060 may be etched from areas where the third insulating layer 2013 is not formed.

After the step (d) is completed, a pair of residual assembly electrodes 2061 and 2062 may be left on the base unit 2010. That is, the pair of residual assembly electrodes 2061 and 2062 may be the protrusion 2060b which is left after the removal of the extension 2060a of the assembly electrode 2060.

Meanwhile, a conductive material (for example, metal) may fill the via hole H, and may be connected to the p-type and n-type electrode of the semiconductor light-emitting diode 2070, thereby electrically connecting the semiconductor light-emitting diode 2070 and the thin-film transistors 2050.

The display device according to the present disclosure provides efficiency in terms of the manufacturing method, since it employs an existing active matrix-panel manufacturing method and does not require semiconductor light-emitting diodes to be temporarily transferred onto a separate substrate.

The present disclosure as set forth above is not limited to the configuration and method of the above-described embodiments, but all or some of the embodiments may be selectively combined to make various changes to the embodiments.

The invention claimed is:

1. A display device comprising:
a base unit;
data wires and gate wires arranged in columns and rows, respectively, and on the base unit to intersect each other;
a power wire extending in a same direction as the data wires;
thin film transistors connected to the data wires and the gate wires;
a semiconductor light-emitting diode electrically connected to the thin film transistors; and
a pair of residual assembly electrodes, each residual assembly electrode overlapping the semiconductor light-emitting diode while not overlapping both the data wires and the power wire in a thickness direction of the base unit.

2. The display device of claim 1, wherein the pair of residual assembly electrodes includes:

a first residual assembly electrode protruding from a side of the data wires toward the semiconductor light-emitting diode; and
a second residual assembly electrode protruding from a side of the power wire toward the semiconductor light-emitting diode.

3. The display device of claim 2, wherein the first residual assembly electrode and the second residual assembly electrode are separated from each other by a gap, and
wherein the semiconductor light-emitting diode overlaps the gap.

4. The display device of claim 1, comprising:
a first insulating layer disposed between the pair of residual assembly electrodes and both of the data wires and the power wire;
a second insulating layer disposed between the semiconductor light-emitting diode and the pair of residual assembly electrodes; and
a third insulating layer disposed to cover the semiconductor light-emitting diode.

5. The display device of claim 4, wherein the data wires and the power wire each include:
a first portion overlapping the first insulating layer in a thickness direction of the base unit; and
a second portion overlapping the first insulating layer, the second insulating layer, and the third insulating layer in the thickness direction of the base unit.

6. The display device of claim 5, wherein the pair of residual assembly electrodes is located closer to the first portion than to the second portion.

7. The display device of claim 5, wherein the second insulating layer is disconnected over the second portion, and
wherein the third insulating layer is disconnected over the second portion.

8. The display device of claim 1, wherein a parasitic capacitance is not generated between the pair of residual assembly electrodes and both of the data wires and the power wire.

9. A method for manufacturing a display device, the method comprising:
forming data wires and gate wires arranged in columns and rows, respectively, on a base unit to intersect each other, a power wire extending in a same direction as the data wires, and thin-film transistors connected to the data wires and the gate wires;
forming an assembly electrode to extend in the same direction as the data wires, with an extension overlapping either the data wires or the power wire in a thickness direction of the base unit;
seating a semiconductor light-emitting diode in a preset position by applying a voltage signal to the assembly electrode; and
removing the extension of the assembly electrode.

10. The method of claim 9, wherein the base unit includes a pair of residual assembly electrodes which remain after the removal of the extension of the assembly electrode, and
wherein the pair of residual assembly electrodes overlaps the semiconductor light-emitting diode in the thickness direction of the base unit.

11. The method of claim 10, wherein the pair of residual assembly electrodes includes:
a first residual assembly electrode protruding toward the semiconductor light-emitting diode on a side of the data wires; and
a second residual assembly electrode protruding toward the semiconductor light-emitting diode on a side of the power wire.

12. The method of claim 9, wherein the forming of the data wires and the gate wires includes forming a first insulating layer covering the data wires and the gate wires, the forming of the assembly electrode includes forming a second insulating layer covering the assembly electrode, and the seating of the semiconductor light-emitting diode includes seating the semiconductor light-emitting diode in the preset position and then forming a third insulating layer covering the semiconductor light-emitting diode.

13. The method of claim 12, wherein the forming of the third insulating layer is carried out after masking an area of overlap between the data wires and the assembly electrode and an area of overlap between the power wire and the assembly electrode.

14. The method of claim 13, wherein the removing of the extension includes:

selectively etching the second insulating layer which is formed in the area of overlap between the data wires and the assembly electrode and the area of overlap between the power wire and the assembly electrode; and etching the extension of the assembly electrode which overlaps either the data wires or the power wire.

15. The method of claim 9, further comprising forming a via hole and a connecting electrode to electrically connect the semiconductor light-emitting diode and the thin-film transistors.

16. The method of claim 15, wherein the removing of the extension is performed in a process of forming of the via hole and the connecting electrode.

17. A display device comprising:

a base unit;

data wires and gate wires on the base unit and extending in different directions;

a power wire extending in a same direction as the data wires;

an insulating layer on the data wires and the power wire;

thin film transistors connected to the data wires and the gate wires;

a semiconductor light-emitting element electrically connected to the thin film transistors; and a pair of residual assembly electrodes on the insulating layer, each residual assembly electrode being an electrode not overlapping both the data wires and the gate wires in a thickness direction of the base unit.

18. The display device of claim 17, wherein the pair of residual assembly electrodes includes a first residual assembly electrode and a second residual assembly electrode that are separated from each other, and overlapping with the semiconductor light-emitting element.

* * * * *